(12) United States Patent
Yamaguchi et al.

(10) Patent No.: US 11,728,132 B2
(45) Date of Patent: Aug. 15, 2023

(54) ION IMPLANTER AND ION IMPLANTATION METHOD

(71) Applicant: SUMITOMO HEAVY INDUSTRIES ION TECHNOLOGY CO., LTD., Tokyo (JP)

(72) Inventors: Mikio Yamaguchi, Ehime (JP); Kazuhisa Ishibashi, Ehime (JP); Tetsuya Kudo, Ehime (JP)

(73) Assignee: SUMITOMO HEAVY INDUSTRIES ION TECHNOLOGY CO., LTD., Tokyo (JP)

(*) Notice: Subject to any disclaimer, the term of this patent is extended or adjusted under 35 U.S.C. 154(b) by 0 days.

(21) Appl. No.: 17/666,952

(22) Filed: Feb. 8, 2022

(65) Prior Publication Data

US 2022/0254602 A1  Aug. 11, 2022

(30) Foreign Application Priority Data

Feb. 9, 2021  (JP) ................................. 2021-019204

(51) Int. Cl.
*H01J 37/304* (2006.01)
*H01J 37/317* (2006.01)

(52) U.S. Cl.
CPC ........ *H01J 37/304* (2013.01); *H01J 37/3171* (2013.01)

(58) Field of Classification Search
CPC .......................... H01J 37/304; H01J 37/3171
See application file for complete search history.

(56) References Cited

U.S. PATENT DOCUMENTS

| | | | |
|---|---|---|---|
| 6,662,059 B2 | 12/2003 | Ito et al. | |
| 9,978,554 B1* | 5/2018 | Koo | .......................... H01J 1/50 |
| 10,515,780 B1* | 12/2019 | Nouri | .................. H01J 37/3023 |
| 2003/0042427 A1* | 3/2003 | Sullivan | ................ H01J 37/304 250/397 |
| 2006/0249696 A1* | 11/2006 | Chang | ................. H01J 37/3023 250/492.21 |
| 2011/0248182 A1* | 10/2011 | Nishihashi | ............... G11B 5/85 250/453.11 |
| 2021/0040604 A1* | 2/2021 | Ishibashi | ............. H01J 37/3171 |

FOREIGN PATENT DOCUMENTS

JP  2002-287803 A  10/2002
JP  2020-161470 A  10/2020

* cited by examiner

*Primary Examiner* — Sean M Luck
(74) *Attorney, Agent, or Firm* — Michael Best & Friedrich LLP (57) ABSTRACT

An ion implanter includes a beam generation device that generates an ion beam with which a workpiece is irradiated, a control device that sets a plurality of operation parameters for controlling an operation of the beam generation device, a measurement device that measures at least one of beam characteristics of the ion beam, a storage device that accumulates data sets in each of which a set of set values of the plurality of operation parameters and a measurement value of the at least one of the beam characteristics of the ion beam are associated with each other, and an analysis device that generates a function for estimating the at least one of the beam characteristics from a set value of at least one of specific parameters included in the plurality of operation parameters, based on a plurality of the data sets accumulated in the storage device.

19 Claims, 6 Drawing Sheets

ION IMPLANTER AND ION IMPLANTATION METHOD

RELATED APPLICATIONS

The content of Japanese Patent Application No. 2021-019204, on the basis of which priority benefits are claimed in an accompanying application data sheet, is in its entirety incorporated herein by reference.

BACKGROUND

Technical Field

Certain embodiments of the present invention relate to an ion implanter and an ion implantation method.

Description of Related Art

In a semiconductor manufacturing process, a process of implanting ions into a semiconductor wafer (also referred to as an ion implantation process) is generally performed in order to change conductivity of a semiconductor, or in order to change a crystal structure of the semiconductor. A device used for the ion implantation process is called an ion implanter. The ion implanter is configured to realize desired beam characteristics by measuring beam characteristics such as a beam current and a beam angle of an ion beam to be used for irradiating a wafer and adjusting an operation parameter, based on a measurement value.

SUMMARY

According to an embodiment of the present invention, there is provided ion implanter including a beam generation device that generates an ion beam with which a workpiece is irradiated, a control device that sets a plurality of operation parameters for controlling an operation of the beam generation device, a measurement device that measures at least one of beam characteristics of the ion beam, a storage device that accumulates data sets in each of which a set of set values of the plurality of operation parameters and a measurement value of the at least one of the beam characteristics of the ion beam are associated with each other, and an analysis device that generates a function for estimating the at least one of the beam characteristics from a set value of at least one of specific parameters included in the plurality of operation parameters, based on a plurality of the data sets accumulated in the storage device. When the set value of the at least one of the specific parameters included in the plurality of operation parameters is changed, the control device inputs the changed set value of the at least one of the specific parameters into the function, and calculates an estimated value of the at least one of the beam characteristics.

According to another embodiment of the present invention, there is provided an ion implantation method. The ion implantation method includes accumulating data sets in each of which a set of set values of a plurality of operation parameters for controlling an operation of a beam generation device generating an ion beam and a measurement value of at least one of beam characteristics of the ion beam are associated with each other, classifying a plurality of the accumulated data sets into a plurality of clusters, generating a plurality of functions for estimating the at least one of the beam characteristics from a set value of at least one of specific parameters included in the plurality of operation parameters, the plurality of functions respectively corresponding to the plurality of clusters, specifying one of the plurality of clusters into which the plurality of operation parameters including the set value of the at least one of the specific parameters before or after changing is classified, when the set value of the at least one of the specific parameters included in the plurality of operation parameters set for the beam generation device is changed, and inputting the changed set value of the at least one of the specific parameters into the function corresponding to the specified cluster, and calculating an estimated value of the at least one of the beam characteristics.

DETAILED DESCRIPTION

In recent years, accuracy in the beam characteristics is more strictly required, and it may take time to perform adjustment for realizing the desired beam characteristics. In addition, even when the operation parameters having an actual result in the past are used, in some cases, beam characteristics equivalent to that obtained in the past cannot be realized without any change. In this case, time-consuming measurement and adjustment have to be repeated. When a time required for the adjustment is lengthened, productivity of the ion implanter is degraded.

It is desirable to provide a technique for more quickly adjusting an operation parameter.

Any desired combination of the above-described components, and those in which the components or expressions according to the present invention are substituted from each other in methods, devices, or systems are effectively applicable as an aspect of the present invention.

According to the present invention, an operation parameter can more quickly be adjusted.

Hereinafter, embodiments according to the present invention will be described in detail with reference to the drawings. In describing the drawings, the same reference numerals will be assigned to the same elements, and repeated description will be appropriately omitted. Configurations described below are merely examples, and do not limit the scope of the present invention in any way.

Before the embodiments are described in detail, an outline will be described. An ion implanter according to the present embodiment includes a beam generation device that generates an ion beam with which a wafer is irradiated, a control device that sets a plurality of operation parameters for controlling an operation of the beam generation device, and a measurement device that measures at least one beam characteristic of the ion beam. The control device adjusts the operation parameter so that the ion beam having a desired beam characteristic is generated before an ion implantation process for irradiating the wafer with the ion beam. For example, when at least one beam characteristic is measured after the operation parameter is set and a measurement value of the beam characteristic deviates from a target value, at least one operation parameter is adjusted so that the beam characteristic approaches the target value.

The above-described adjustment process needs to be performed on all of a plurality of the beam characteristics of the ion beam. Here, the plurality of beam characteristics include beam energy, a beam current, a beam current density distribution, a beam size, a beam angle, and beam parallelism. In recent years, accuracy in the beam characteristics is more strictly required, and it is necessary to highly accurately adjust each of the plurality of beam characteristics. On the other hand, when each of the plurality of beam characteristics is individually measured and the operation parameter is highly accurately adjusted, based on the measurement value, a time required for adjustment is extremely lengthened, and thus, productivity of the ion implanter is degraded.

Therefore, in the present embodiment, instead of measuring at least one beam characteristic, the at least one beam characteristic can be estimated. In this manner, even when measuring the at least one beam characteristic is skipped, the adjustment can be performed, based on an estimated value. Specifically, a function for estimating the at least one beam characteristic is generated from set values of the plurality of operation parameters set in the beam generation device, and the at least one beam characteristic is estimated by using the function. The function is generated, based on a plurality of data sets accumulated in association with an operation of the ion implanter. Each of the data sets is a data set in which a set of set values of the plurality of operation parameters is associated with a measurement value of the at least one beam characteristic. By using the function, whether or not the at least one beam characteristic satisfies a desired condition can be estimated without measuring the at least one beam characteristic after the operation parameter is changed.

Figure 1:
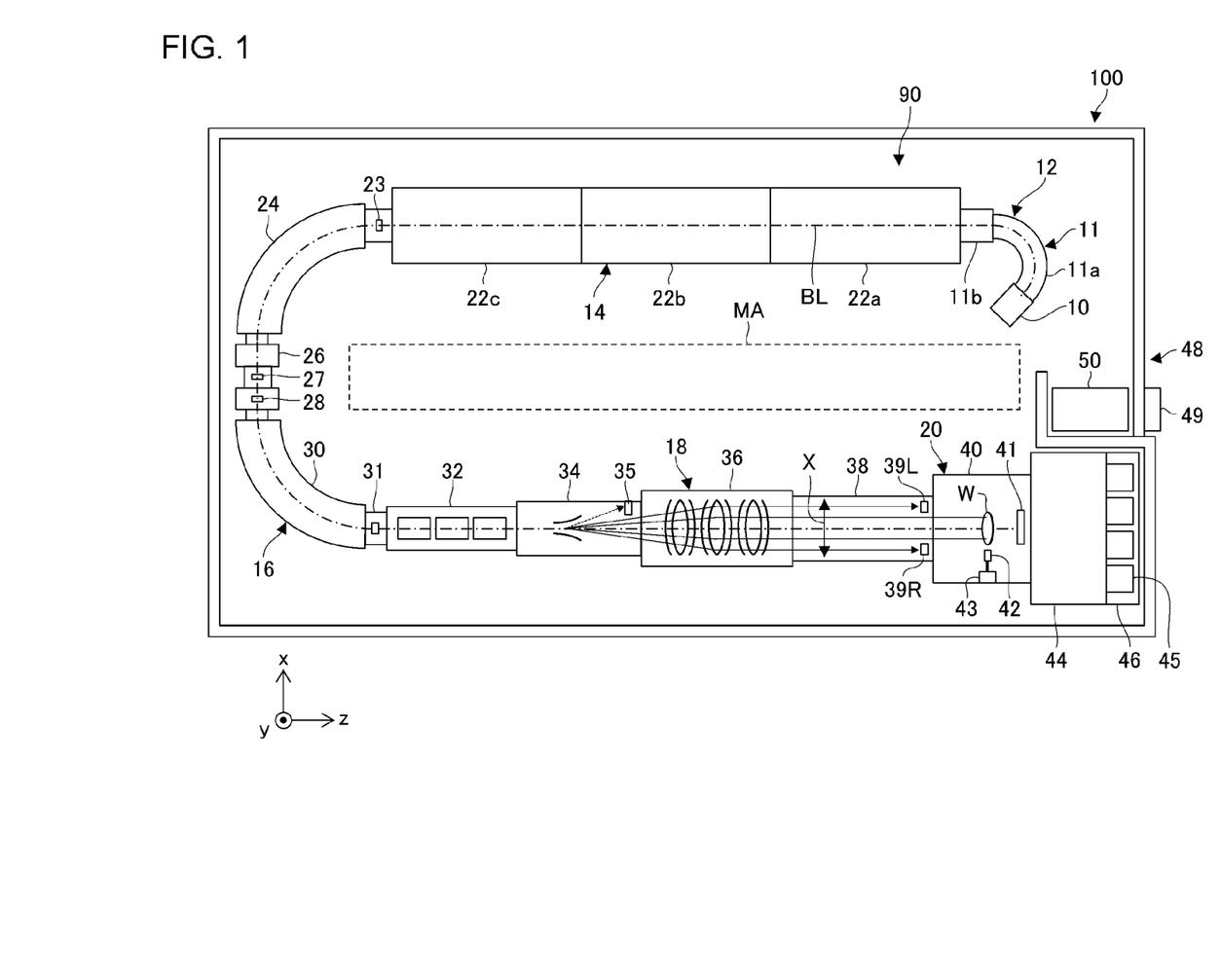
FIG. 1 is a top view illustrating a schematic configuration of an ion implanter according to an embodiment.

FIG. 1 is a top view schematically illustrating an ion implanter 100 according to the embodiment. The ion implanter 100 includes a beam generation device 90. The beam generation device 90 includes an ion generation unit 12, a beam acceleration unit 14, a beam deflection unit 16, and a beam transport unit 18. The ion implanter 100 further includes a substrate transferring/processing unit 20. In the present specification, the ion generation unit 12, the beam acceleration unit 14, the beam deflection unit 16, and the beam transport unit 18 are collectively referred to as the "beam generation device 90".

The ion generation unit 12 has an ion source 10 and a mass analyzer 11. In the present specification, the ion generation unit 12 is also referred to as an "ion generation device". In the ion generation unit 12, an ion beam is extracted from the ion source 10, and the extracted ion beam is subjected to mass analysis by the mass analyzer 11. The mass analyzer 11 has a mass analyzing magnet 11a and a mass resolving slit 11b. The mass resolving slit 11b is disposed on the downstream side of the mass analyzing magnet 11a. As a result of mass analyzing performed by the mass analyzer 11, only an ion species required for implantation is selected, and the ion beam of the selected ion species is guided to the subsequent beam acceleration unit 14.

The beam acceleration unit 14 has a plurality of linear acceleration units 22a, 22b, and 22c for accelerating the ion beam and a beam measurement unit 23, and forms a linearly extending portion of a beamline BL. Each of the plurality of linear acceleration units 22a to 22c includes one or more high frequency accelerators respectively in one or more stages, and causes a radio frequency (RF) electric field to act on the ion beam to accelerate the ion beam. The beam measurement unit 23 is provided most downstream of the beam acceleration unit 14, and measures the at least one beam characteristic of a high energy ion beam accelerated by the plurality of linear acceleration units 22a to 22c. The beam measurement unit 23 may be a measurement device that measures beam characteristics such as beam energy, a beam current, and a beam profile.

In the present embodiment, three linear acceleration units 22a to 22c are provided. The first linear acceleration unit 22a is provided in an upper stage of the beam acceleration unit 14, and includes the high frequency accelerators respectively in the plurality of stages (for example, 5 to 15 stages). The first linear acceleration unit 22a performs "bunching" of a continuous beam (DC beam) output from the ion generation unit 12 to match a specific acceleration phase, and accelerates the ion beam to have the energy of approximate 1 MeV, for example. The second linear acceleration unit 22b is provided in a middle stage of the beam acceleration unit 14, and includes the high frequency accelerators respectively in the plurality of stages (for example, 5 to 15 stages). The second linear acceleration unit 22b accelerates the ion beam output from the first linear acceleration unit 22a to have the energy of approximate 2 to 3 MeV, for example. The third linear acceleration unit 22c is provided in a lower stage of the beam acceleration unit 14, and includes the high frequency accelerators respectively in the plurality of stages (for example, 5 to 15 stages). The third linear acceleration unit 22c accelerates the ion beam output from the second linear acceleration unit 22b to have the high energy of 4 MeV or higher, for example.

The high energy ion beam output from the beam acceleration unit 14 has an energy distribution in a certain range. Therefore, in order that the high energy ion beam is scanned and parallelized downstream of the beam acceleration unit 14 to irradiate the wafer, highly accurate energy analysis, energy distribution control, trajectory correction, and beam convergence/divergence adjustment need to be performed in advance.

The beam deflection unit 16 performs energy analysis, energy distribution control, and trajectory correction of the high energy ion beam output from the beam acceleration unit 14. The beam deflection unit 16 forms a portion extending in an arc shape in the beamline BL. A direction of the high energy ion beam is changed toward the beam transport unit 18 by the beam deflection unit 16.

The beam deflection unit 16 includes an energy analysis electromagnet 24, a horizontally focusing quadrupole lens 26 that suppresses energy dispersion, an energy resolving slit 27, a first Faraday cup 28, a bending electromagnet 30 that provides beam steering (trajectory correction), and a second Faraday cup 31. The energy analysis electromagnet 24 is referred to as an energy filter electromagnet (EFM). In addition, a device group including the energy analysis electromagnet 24, the horizontally focusing quadrupole lens 26, the energy resolving slit 27, and the first Faraday cup 28 is collectively referred to as an "energy analysis device".

The energy resolving slit 27 may be configured so that a slit width is variable to adjust resolution of the energy analysis. For example, the energy resolving slit 27 may be configured to include two blocking bodies that are movable in a slit width direction, and may be configured so that the slit width is adjustable by changing an interval between the two blocking bodies. The energy resolving slit 27 may be configured so that the slit width is variable by selecting any one of a plurality of slits having different slit widths.

The first Faraday cup 28 is disposed immediately after the energy resolving slit 27, and is used in measuring the beam current for the energy analysis. The second Faraday cup 31 is disposed immediately after the bending electromagnet 30, and is provided to measure the beam current of the ion beam which enters the beam transport unit 18 after beam trajectory correction. Each of the first Faraday cup 28 and the second Faraday cup 31 is configured to be movable into and out of the beamline BL by an operation of a Faraday cup drive unit (not illustrated). Each of the first Faraday cup 28 and the second Faraday cup 31 may be a measurement device that measures the beam characteristics such as the beam current and the beam profile.

The beam transport unit 18 forms the other linearly extending portion of the beamline BL, and is parallel to the beam acceleration unit 14 while a maintenance area MA in the center of the ion implanter 100 is interposed therebetween. A length of the beam transport unit 18 is designed to be approximately the same as a length of the beam acceleration unit 14. As a result, the beamline BL including the beam acceleration unit 14, the beam deflection unit 16, and the beam transport unit 18 forms a U-shaped layout as a whole. In the present specification, the beam transport unit 18 is also referred to as a "beamline unit".

The beam transport unit 18 includes a beam shaper 32, a beam scanner 34, a beam dump 35, a beam parallelizer 36, a final energy filter 38, and left and right Faraday cups 39L and 39R.

The beam shaper 32 includes a focusing/defocusing lens such as a quadrupole lens device (Q lens), and is configured to shape the ion beam having passed through the beam deflection unit 16 into a desired cross-sectional shape. For example, the beam shaper 32 is configured to include an electric field type three-stage quadrupole lens (also referred to as a triplet Q lens), and has three electrostatic quadrupole lens devices. The beam shaper 32 can independently adjust convergence or divergence of the ion beam in each of a horizontal direction (x-direction) and a vertical direction (y-direction) by using the three lens devices. The beam shaper 32 may include a magnetic field type lens device, or may include a lens device that shapes the beam by using both an electric field and a magnetic field.

The beam scanner 34 is a beam deflection device configured to provide reciprocating scanning with the beam and to perform scanning in the x-direction with the shaped ion beam. The beam scanner 34 has a scanning electrode pair facing in a beam scanning direction (x-direction). The scanning electrode pair is connected to a variable voltage power supply (not illustrated), and a voltage applied between the scanning electrode pair is periodically changed. In this manner, an electric field generated between the electrodes is changed so that the ion beam is deflected at various angles. As a result, the scanning with the ion beam is performed over a scanning range indicated by an arrow X. In FIG. 1, a plurality of trajectories of the ion beam in the scanning range are indicated by a fine solid line. The beam scanner 34 may be replaced with another beam scan unit, and the beam scan unit may be configured to serve as an electromagnet device using the magnetic field.

The beam scanner 34 deflects the beam beyond the scanning range indicated by the arrow X. In this manner, the ion beam is incident into the beam dump 35 provided at a position away from the beamline BL. The beam scanner 34 temporarily evacuates the ion beam from the beamline BL toward the beam dump 35, thereby blocking the ion beam so that the ion beam does not reach the substrate transferring/processing unit 20 located downstream.

The beam parallelizer 36 is configured so that a traveling direction of the ion beam used for the scanning is parallel to the trajectory of the designed beamline BL. The beam parallelizer 36 has a plurality of arc-shaped parallelizing lens electrodes, in a central portion of each of which a passing slit for the ion beam is provided. The parallelizing lens electrodes are connected to high-voltage power supplies (not illustrated), and applies the electric field generated by voltage application to the ion beam so that the traveling directions of the ion beam are parallelized. The beam parallelizer 36 may be replaced with another beam parallelizing device, and the beam parallelizing device may be configured to serve as an electromagnet device using the magnetic field.

The final energy filter 38 is configured to analyze the energy of the ion beam and deflect the ions having the required energy downward (in the −y-direction) so that the ions are guided to the substrate transferring/processing unit 20. The final energy filter 38 is referred to as an angular energy filter (AEF), and has an AEF electrode pair for electric field deflection. The AEF electrode pair is connected to a high-voltage power supply (not illustrated). The ion beam is deflected downward by applying a positive voltage to an upper AEF electrode and applying a negative voltage to a lower AEF electrode. The final energy filter 38 may be configured to include an electromagnet device for magnetic field deflection, or may be configured to include a combination between the AEF electrode pair for electric field deflection and the electromagnet device for magnetic field deflection.

The left and right Faraday cups 39L and 39R are provided on the downstream side of the final energy filter 38, and are disposed at positions into which the left and right end beams in the scanning range indicated by the arrow X can be incident. The left and right Faraday cups 39L and 39R are provided at positions that do not block the beam toward the wafer W, and measure the beam current into the wafer W during ion implantation.

The substrate transferring/processing unit 20 is provided on the downstream side of the beam transport unit 18, that is, on the most downstream side of the beamline BL. The substrate transferring/processing unit 20 includes an implantation processing chamber 40, a beam monitor 41, a beam profiler 42, a profiler driving device 43, a substrate transfer device 44, and a load port 46. The implantation processing chamber 40 is provided with a platen driving device (not illustrated) that holds the wafer W during the ion implantation and moves the wafer W in a direction (y-direction) perpendicular to the beam scanning direction (x-direction).

The beam monitor 41 is provided on the most downstream side of the beamline BL inside the implantation processing chamber 40. The beam monitor 41 is provided at a position into which the ion beam can be incident when the wafer W is not present on the beamline BL, and is configured to measure beam characteristics before or between the ion implantation processes. The beam monitor 41 may be a measurement device that measures the beam characteristics such as the beam current, the beam current density distribution, the beam angle, and the beam parallelism. For example, the beam monitor 41 is located close to a transfer port (not illustrated) connecting the implantation processing chamber 40 and the substrate transfer device 44, and is provided at a position vertically below the transfer port.

The beam profiler 42 is configured to measure the beam current at a position on the surface of the wafer W. The beam profiler 42 is configured to be movable in the x-direction by an operation of the profiler driving device 43, is retreated from an implantation position where the wafer W is located during the ion implantation, and is inserted into the implantation position when the wafer W is not located at the implantation position. The beam profiler 42 measures the beam current while moving in the x-direction. In this manner, the beam profiler 42 can measure the beam current over the entire beam scanning range in the x-direction. In the beam profiler 42, a plurality of Faraday cups may be aligned in an array in the x-direction so that the beam currents can be simultaneously measured at a plurality of positions in the beam scanning direction (x-direction). The beam profiler 42 may be a measurement device that measures a beam current density distribution in the x-direction.

The beam profiler 42 may include a single Faraday cup for measuring the beam current, or may include an angle measurement device for measuring angle information of the beam. For example, the angle measurement device includes a slit and a plurality of current detectors provided away from the slit in the beam traveling direction (z-direction). For example, the angle measurement device can measure angle components of the beam in the slit width direction by causing the plurality of current detectors aligned in the slit width direction to measure the beam having passed through the slit. The beam profiler 42 may include a first angle measurement device capable of measuring angle information in the x-direction and a second angle measurement device capable of measuring angle information in the y-direction. The beam profiler 42 may be a measurement device that measures a beam angle in the x-direction and a beam angle in the y-direction. The beam profiler 42 may measure an angle center or a convergence/divergence angle as the angle information of the beam.

The substrate transfer device 44 is configured to transfer the wafer W between the load port 46 on which a wafer container 45 is mounted and the implantation processing chamber 40. The load port 46 is configured so that a plurality of the wafer containers 45 can be mounted at the same time, and for example, has four mounting tables aligned in the x-direction. A wafer container transfer port (not illustrated) is provided vertically above the load port 46, and is configured so that the wafer container 45 can pass through the wafer container transfer port in the vertical direction. For example, the wafer container 45 is automatically loaded onto the load port 46 through the wafer container transfer port by a transfer robot installed on a ceiling in a semiconductor manufacturing factory where the ion implanter 100 is installed, and is automatically unloaded from the load port 46.

The ion implanter 100 further includes a central control device 50.

The central control device 50 controls an overall operation of the ion implanter 10. The central control device 50 is realized by an element or a machine device such as a computer CPU and a memory in terms of hardware, and is realized by a computer program or the like in terms of software. Various functions provided by the central control device 50 can be realized in cooperation between the hardware and the software.

An operation panel 49 having a display unit and an input device for setting the operation parameters of the ion implanter 100 is provided in the vicinity of the central control device 50. The positions of the operation panel 49 and the central control device 50 are not particularly limited. However, for example, the operation panel 49 and the central control device 50 can be disposed adjacent to an entrance/exit 48 of the maintenance area MA between the ion generation unit 12 and the substrate transferring/processing unit 20. Work efficiency can be improved by adjoining locations of the ion source 10, the load port 46, the operation panel 49, and the central control device 50 which are frequently operated by an operator who manages the ion implanter 100.

Figure 2:
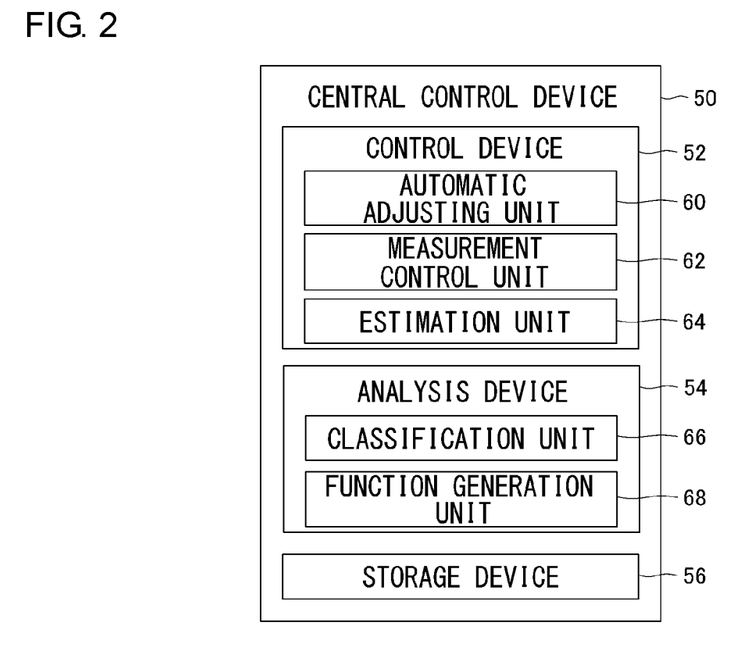
FIG. 2 is a block diagram schematically illustrating a functional configuration of a central control device.

FIG. 2 is a block diagram schematically illustrating a functional configuration of the central control device 50. The central control device 50 includes a control device 52, an analysis device 54, and a storage device 56.

The control device 52 sets the plurality of operation parameters for controlling an operation of the beam generation device 90. The control device 52 includes an automatic adjusting unit 60, a measurement control unit 62, and an estimation unit 64. The automatic adjusting unit 60 executes an automatic adjusting program for adjusting the plurality of operation parameters, and adjusts the plurality of operation parameters so that a desired beam characteristic is realized. The measurement control unit 62 controls an operation of the measurement device, and acquires the measurement value of the at least one beam characteristic. The estimation unit 64 calculates an estimated value of the at least one beam characteristic by using a function generated by the analysis device 54.

The analysis device 54 analyzes the plurality of data sets stored in the storage device 56. The analysis device 54 includes a classification unit 66 and a function generation unit 68. The classification unit 66 classifies the plurality of data sets into a plurality of clusters. The function generation unit 68 generates the function for estimating the at least one beam characteristic for each of the clusters classified by the classification unit 66. The function generation unit 68 generates a plurality of functions respectively corresponding to the plurality of clusters.

The storage device 56 stores the data set in which a set of set values of the plurality of operation parameters and the measurement value of the at least one beam characteristic are associated with each other. The storage device 56 associates the set of the set values of the plurality of operation parameters adjusted by the automatic adjusting unit 60 with the measurement value of the at least one beam characteristic acquired by the measurement device, and stores the associated information as one data set. The storage device 56 stores the plurality of data sets generated in association with an operation of the ion implanter 100.

Figure 3:
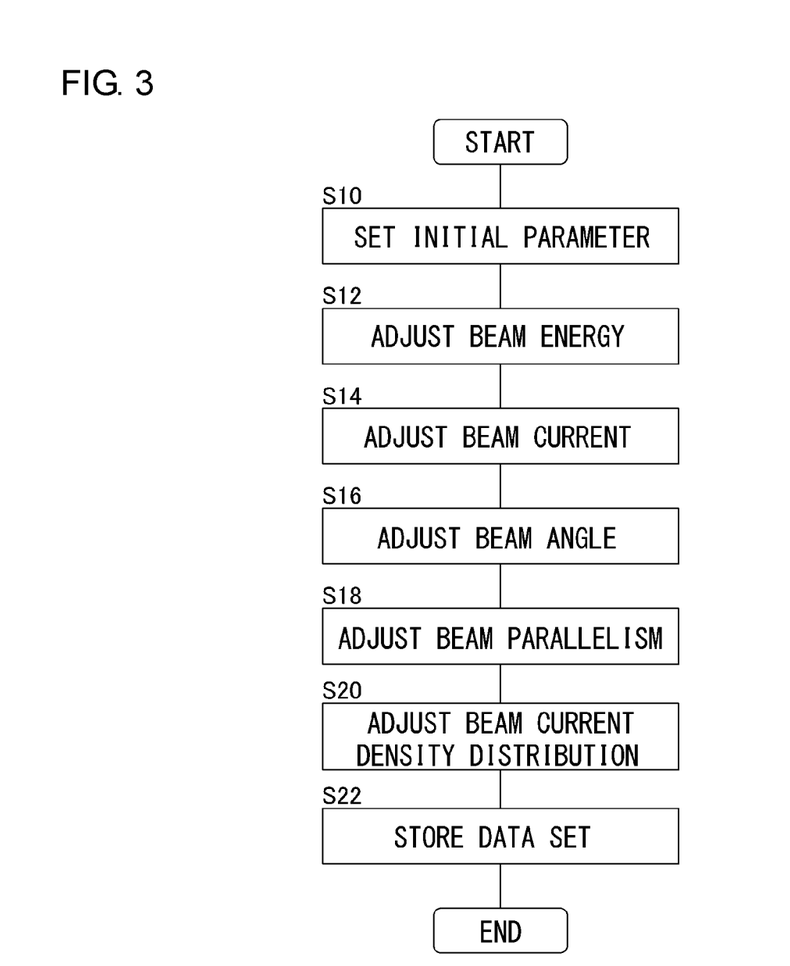
FIG. 3 is a flowchart illustrating an example of an adjustment method for operation parameters.

FIG. 3 is a flowchart illustrating an example of an adjustment method for the operation parameters. First, initial values (also referred to as initial parameters) of the plurality of operation parameters are set (S10).

Subsequently, the plurality of beam characteristics of the ion beam are adjusted (S12 to S20). In an example in FIG. 3, the beam energy (S12), the beam current (S14), the beam angle (S16), the beam parallelism (S18), and the beam current density distribution (S20) are sequentially adjusted. Finally, adjusted data set is stored (S22). An adjustment order in S12 to S20 is not limited, and the adjustment order may appropriately be changed. In addition, a specific beam characteristic may be adjusted a plurality of times. For example, a second beam characteristic may be adjusted after a first beam characteristic is adjusted, and thereafter, the first beam characteristic may be adjusted again.

In S10, for example, the initial parameters corresponding to a target beam characteristic are determined. The automatic adjusting unit 60 may determine the initial parameters by performing a simulation using a predetermined algorithm. The automatic adjusting unit 60 may determine the initial parameters, based on the data set stored in the storage device 56. For example, when there is a past data set for which the ion beam having the beam characteristic that coincides with or approximates the target beam characteristic was obtained, a set value of the operation parameters included in the data set may be used as the initial parameters.

In adjusting the beam energy in S12, the operation parameters of the ion generation unit 12 and the beam acceleration unit 14 are adjusted. Specifically, the beam energy is adjusted by changing the operation parameters such as an extraction voltage of the ion source 10, and an amplitude, a frequency, and a phase of a high frequency voltage VRF applied to each of the high frequency accelerators in the plurality of stages included in the beam acceleration unit 14. For example, the beam energy is measured by the beam measurement unit 23.

In adjusting the beam current in S14, the operation parameters of the ion generation unit 12 and the beam acceleration unit 14 are adjusted. Specifically, the beam current is adjusted by changing the operation parameters such as a source gas flow rate, an arc current, an arc voltage and a source magnet current of the ion source 10 and slit opening widths of the mass resolving slit 11b and the energy resolving slit 27. For example, the beam current is measured by the beam measurement unit 23, the first Faraday cup 28, the second Faraday cup 31, the beam monitor 41 or the beam profiler 42.

In adjusting the beam angle in S16, the operation parameters of the beam deflection unit 16 and the beam transport unit 18 are adjusted. For example, the center of the beam angle in the x-direction is adjusted by a magnet current of the bending electromagnet 30. The center of the beam angle in the y-direction is adjusted by an applied voltage of the final energy filter 38. The convergence/divergence angles in the x-direction and the y-direction are adjusted by an applied voltage of the Q lens included in the beam shaper 32. The beam size may be adjusted by changing the applied voltage of the Q lens included in the beam shaper 32. For example, the beam angle and the beam size are measured by the beam monitor 41 or the beam profiler 42.

In adjusting the beam parallelism in S18, the operation parameter of the beam transport unit 18 is adjusted. Specifically, the beam parallelism is adjusted by changing the applied voltage of the parallelizing lens electrode included in the beam parallelizer 36. For example, the beam parallelism is measured by the beam monitor 41 or the beam profiler 42.

In adjusting the beam current density distribution in S20, the operation parameter of the beam transport unit 18 is adjusted. Specifically, the beam current density distribution in the x-direction is adjusted by changing a voltage waveform applied to the scanning electrode pair included in the beam scanner 34. For example, the beam current density distribution is measured by the beam monitor 41 or the beam profiler 42.

In the adjustment processes in S12 to S20, for example, the beam characteristic to be adjusted is measured, and at least one operation parameter is adjusted, based on the measurement value of the measured beam characteristic. The measurement control unit 62 operates the measurement device to acquire the measurement value of the beam characteristic to be adjusted. When the measurement value of the beam characteristic satisfies a desired condition, the automatic adjusting unit 60 completes adjusting the beam characteristic to be adjusted. When the measurement value of the beam characteristic does not satisfy the desired condition, the automatic adjusting unit 60 adjusts a set value of the operation parameter so that the beam characteristic satisfies the desired condition.

In the adjustment processes in S12 to S20, instead of measuring the beam characteristic to be adjusted, an estimated value of the beam characteristic may be calculated, and the at least one operation parameter may be adjusted, based on the estimated value of the beam characteristic. The estimation unit 64 calculates the estimated value of the at least one beam characteristic by using a function generated by the function generation unit 68. When the estimated value of the beam characteristic satisfies the desired condition, the automatic adjusting unit 60 skips the measurement of the beam characteristic to be adjusted, and completes adjusting the beam characteristic to be adjusted. The automatic adjusting unit 60 may adjust the at least one operation parameter, based on the function generated by the function generation unit 68. For example, a value of the operation parameter may be calculated by using the function so that the estimated value of the beam characteristic satisfies the desired condition. When the estimated value of the beam characteristic acquired from the estimation unit 64 does not satisfy the desired condition, the automatic adjusting unit 60 adjusts the set value of the operation parameter, based on the estimated value. When the operation parameter is not successfully adjusted, based on the estimated value, the automatic adjusting unit 60 may adjust the operation parameter, based on the measurement value. When reliability of the estimated value is low, the automatic adjusting unit 60 may adjust the operation parameter, based on the measurement value. For example, the reliability of the estimated value is determined, based on the number and accumulation timings of the accumulated data sets used for generating the function. Details will separately be described later.

Figure 4:
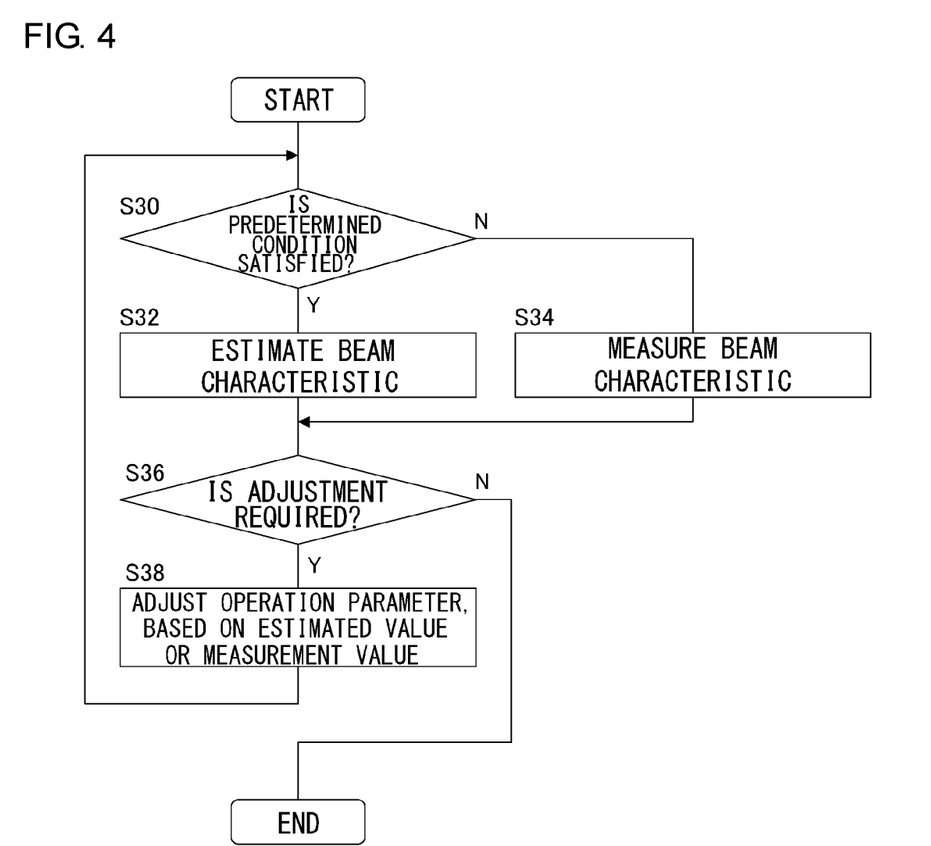
FIG. 4 is a flowchart illustrating an example of an adjustment method for a beam characteristic.

FIG. 4 is a flowchart illustrating an example of an adjustment method for the beam characteristics. FIG. 4 illustrates details of a process of adjusting one beam characteristic in each of S12 to S20 in FIG. 3. When a predetermined condition is satisfied (Y in S30), the beam characteristic to be adjusted is estimated by using the function (S32). When the predetermined condition is not satisfied (N in S30), the beam characteristic to be adjusted is measured by using the measurement device (S34). Here, the predetermined condition in S30 may include various conditions. The predetermined condition is satisfied when the beam characteristic to be adjusted can be estimated, when the estimated value of the beam characteristic to be adjusted is reliable, or when the number of adjustments based on the estimated value is smaller than a predetermined number. When it is necessary to adjust the estimated or measured beam characteristic (Y in S36), the operation parameter is adjusted, based on the estimated value or the measurement value of the beam characteristic (S38), and the process returns to S30. When it is not necessary to adjust the beam characteristic in S36 (N in S36), the flow ends.

As an example of the flow in FIG. 4, when the predetermined condition is satisfied in S30, the operation parameter is adjusted, based on the estimated value of the beam characteristic. When the estimated value of the beam characteristic satisfies the desired condition, adjusting the operation parameter is completed. In this case, the measurement of the beam characteristic is skipped in the adjustment process of the beam characteristic. Accordingly, a time required for the measurement of the beam characteristic can be shortened. On the other hand, when the predetermined condition is not satisfied in S30, the operation parameter is adjusted, based on the measurement value of the beam characteristic. The measurement value of the beam characteristic satisfies the desired condition, adjusting the operation parameter is completed. For example, the beam characteristic is measured, when the estimated value of the beam characteristics is not reliable or when the adjustments based on the estimated value of the beam characteristic is repeated a predetermined number of times. In this manner, the operation parameter can more reliably be adjusted, based on the measurement value.

Subsequently, a function for estimating the beam characteristics will be described. In the present embodiment, the at least one beam characteristic is estimated, based on at least one specific operation parameter (also referred to as a specific parameter) included in the plurality of operation parameters set in the beam generation device 90. The function f is described as q=f(p), where p is the specific parameter and q is the estimated beam characteristic. The specific parameter p is the operation parameter used for adjusting the beam characteristic q. The specific parameter p is the operation parameter having a large correlation with the beam characteristic q, and the beam characteristic q can substantially be adjusted by changing the set value of the specific parameter p. The specific parameter p is determined for each type of the beam characteristics q. The number of the specific parameters p may be one for one beam characteristic q, or may be two or more for one beam characteristic q.

Figure 5:
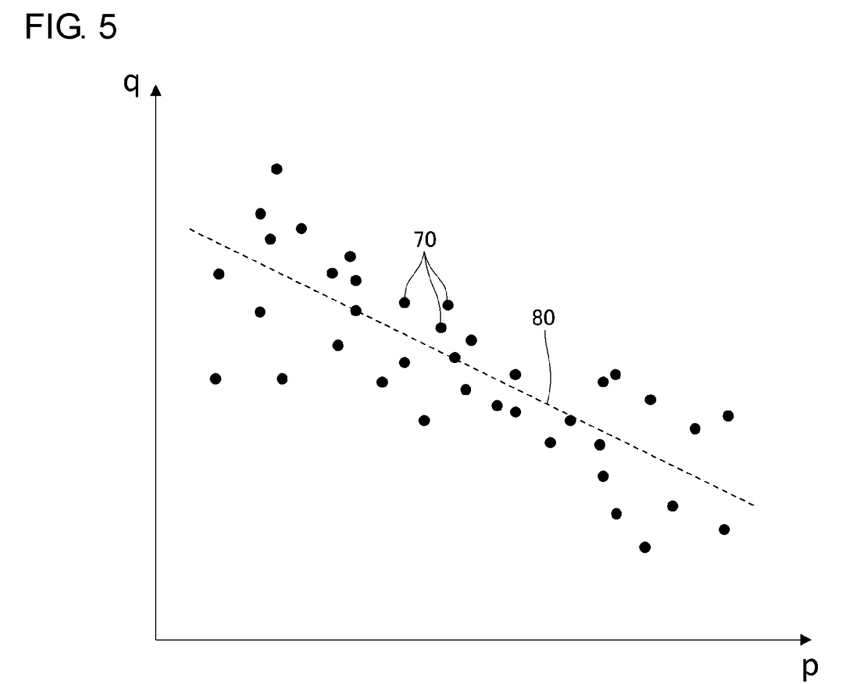
FIG. 5 is a graph schematically illustrating a function indicating a correlation between a specific parameter and a beam characteristic.

FIG. 5 is a graph schematically illustrating a function indicating a correlation between the specific parameter p and the beam characteristic q. A plurality of plots 70 illustrated in the graph of FIG. 5 correspond to the plurality of data sets stored in the storage device 56. Each data set includes set values of the plurality of operation parameters including the specific parameter p and measurement values of the plurality of beam characteristics including the beam characteristic q. The function generation unit 68 determines the function (for example, a straight line 80) indicating the correlation between the specific parameter p and the beam characteristic q, based on the set values of the specific parameter p and the measurement values of the beam characteristic q which are included in respective data set. For example, the straight line 80 is an approximate straight line for the plurality of plots 70, and can be specified by using a least square method. In an example in FIG. 5, a case where the function f is indicated by the straight line 80 is illustrated. However, without being limited to the straight line, the function f may be any desired non-linear function.

Figure 6:
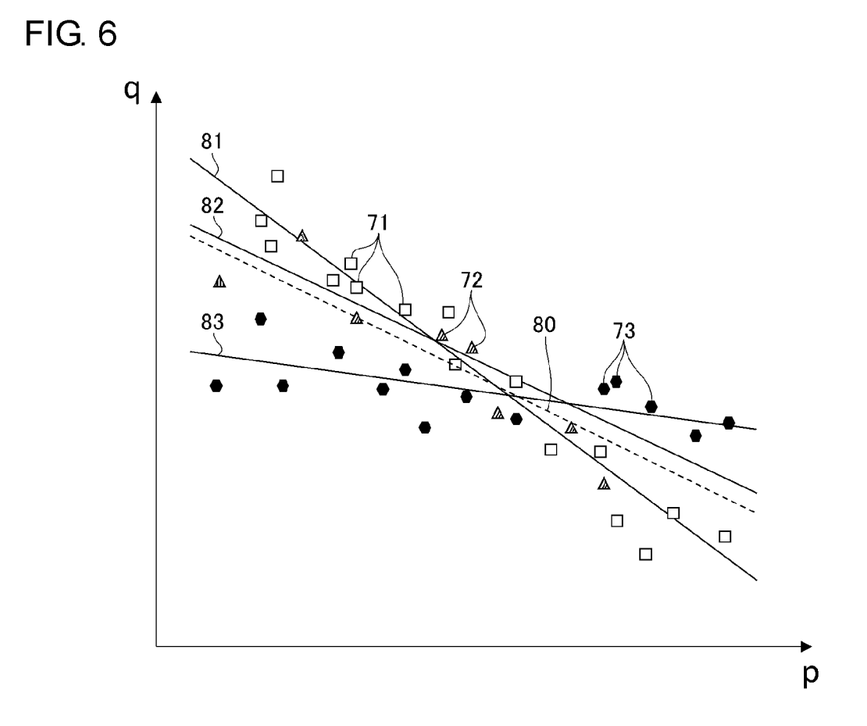
FIG. 6 is a graph schematically illustrating a plurality of functions each of which indicates a correlation between a specific parameter and a beam characteristic.

FIG. 6 is a graph schematically illustrating a plurality of functions indicating correlations between the specific parameter p and the beam characteristic q. In FIG. 6, the data sets the same as those of the example in FIG. 5 are used. However, the plurality of plots 70 illustrated in FIG. 5 are classified into a plurality of clusters to determine the functions (for example, straight lines 81, 82, and 83) for respectively classified cluster. For example, the first straight line 81 is an approximate straight line for a plurality of first plots 71 included in a first cluster. The second straight line 82 is an approximate straight line for a plurality of second plots 72 included in a second cluster. The third straight line 83 is an approximate straight line for a plurality of third plots 73 included in a third cluster. The classification unit 66 classifies the plurality of data sets stored in the storage device 56 into the plurality of clusters. The function generation unit 68 generates the functions (for example, the straight lines 81 to 83) indicating the correlations between the specific parameter p and the beam characteristic q for the respectively classified clusters. In the example in FIG. 6, the plurality of accumulated data sets are clustered, and the function is generated for each cluster. Accordingly, accuracy in estimating the beam characteristic q can be improved, compared to the example in FIG. 5.

Figure 7:
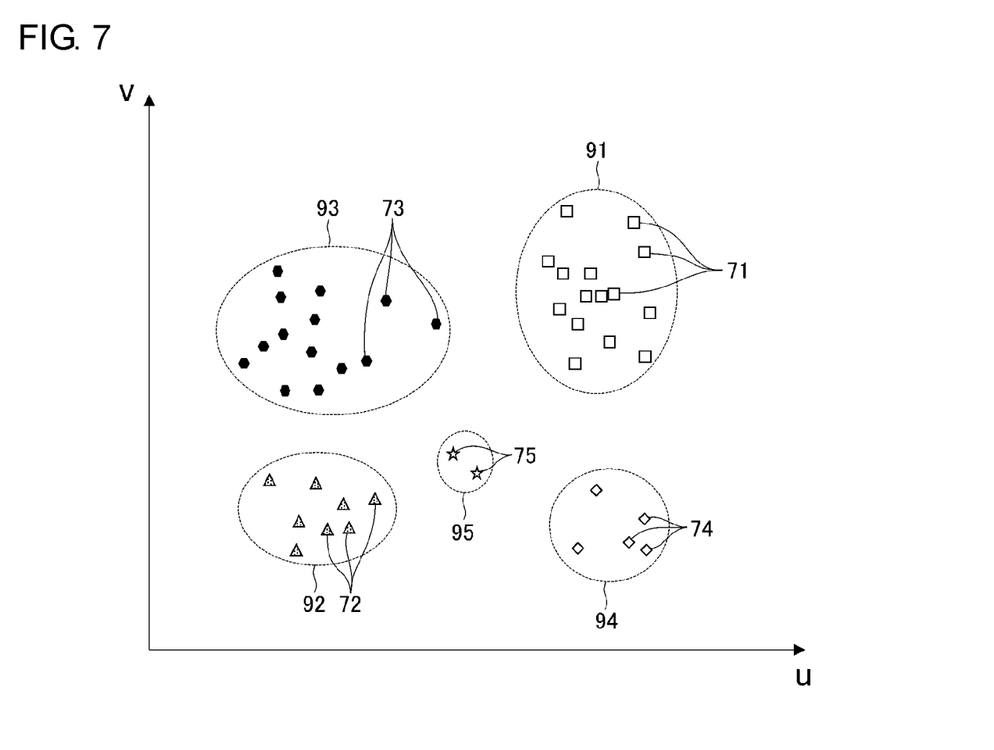
FIG. 7 is a view schematically illustrating a classification method for a plurality of data sets.

FIG. 7 is a view schematically illustrating a classification method for the plurality of data sets. In FIG. 7, the plurality of data sets are classified into five clusters 91, 92, 93, 94, and 95, based on two components u and v included in the data set. The plurality of plots 71 included in the first cluster 91 correspond to the plurality of plots 71 in FIG. 6. The plurality of plots 72 included in the second cluster 92 correspond to the plurality of plots 72 in FIG. 6. The plurality of plots 73 included in the third cluster 93 correspond to the plurality of plots 73 in FIG. 6. For example, the components u and v used for clustering correspond to principal components when the plurality of data sets stored in the storage device 56 are classified by a principal component analysis (PCA). The components u and v used for clustering may be generated by a dimensional compression method other than the PCA. For example, the components u and v are the operation parameters different from the specific parameter p. The components u and v may be a combination of the operation parameter different from the specific parameter p and the beam characteristic different from the beam characteristic q estimated by using the specific parameter p. In the example in FIG. 7, clustering is performed, based on the two principal components u and v. However, the number of the principal components used for clustering may be three or more.

The plurality of clusters 91 to 95 illustrated in FIG. 7 indicate a plurality of device states under which the beam generation device 90 operates. Here, for example, the "device state" can be interpreted as a state expressed by a "hidden parameter" different from the operation parameters that can explicitly be set in the beam generation device 90. For example, when various units forming the beam generation device 90 deteriorate due to the operation, the device state may vary depending on a degree of the deterioration. In addition, when the operations of the beam generation device 90 are switched, the device state after the switching may shift due to the device state before the switching, or the beam generation device 90 may be brought into a transient device state until the device state after the switching is stabilized. When the device states are different in this way, the set values of the plurality of operation parameters required for obtaining the desired beam characteristics may vary depending on the device state. In other words, even when the set values of the plurality of operation parameters are exactly the same, the at least one beam characteristic of the generated ion beam may be different depending on the device state. In view of the differences in the device states, the data set including the sets values of the plurality of operation parameters and the measurement value of the obtained beam characteristics are classified, and the function is generated for each classification. In this manner, the plurality of functions corresponding to the differences in the device states can be generated. As a result, the function can properly be used depending on the differences in the device states, and accuracy in estimating the beam characteristic can be improved by using a proper function corresponding to the device state.

The classification unit 66 analyzes the plurality of data sets stored in the storage device 56, and classifies the data sets into the plurality of clusters. The classification unit 66 classifies the plurality of data sets into the plurality of clusters, based on the correlation between the components u and v different from at least one specific parameter p. When the number of accumulated data sets is small, the classification unit 66 may not be able to classify the plurality of data sets into the plurality of clusters. When a new data set is accumulated in the storage device 56, the classification unit 66 updates the classification of the plurality of clusters by using the plurality of data sets including the new data set. As the number of accumulated data sets increases in association with the operation of the ion implanter 100, the classification of clusters is continuously updated. For example, the cluster is further subdivided, and the number of clusters also increases. As the data sets are progressively accumulated, the differences in the device states can be classified in detail.

The function generation unit 68 generates the function for each of the clusters classified by the classification unit 66. When the number of accumulated data sets is small and the plurality of data sets cannot be classified into the plurality of clusters, the function generation unit 68 may generate only one function, based on the plurality of data sets. When a new data set is accumulated in the storage device 56, the function generation unit 68 updates the function by using the plurality of data sets including the new data set. When the classification of the clusters classified by the classification unit 66 is updated, the function generation unit 68 generates the plurality of functions corresponding to each of the plurality of updated clusters. When the number of accumulated data sets increases in association with the operation of the ion implanter 100, the function can be generated for each of the subdivided clusters. Accordingly, accuracy in estimating the beam characteristic by using the function can be improved. In addition, when the number of accumulated data sets increases, the number of data sets used for generating one function also increases. Accordingly, the accuracy in estimating the beam characteristic by using the function can be improved.

The function generation unit 68 may specify reliability for each generated function. The reliability of the function is specified by the number and the accumulation timings of the accumulated data sets used for generating the function. For example, the function generation unit 68 further improves the reliability of the function generated based on a large number of the data sets than the reliability of the function generated based on a small number of the data sets. For example, the function corresponding to the first cluster 91 or the third cluster 93 in FIG. 7 is more reliable than the function corresponding to the fourth cluster 94 or the fifth cluster 95. For example, the function generation unit 68 further improves the reliability of the function generated based on the data sets accumulated at new accumulation timing than the reliability of the function generated based on the data sets accumulated at old accumulation timing. When the device state of the beam generation device 90 varies with the lapse of time, it is highly possible that the device state corresponding to the old data set may be different from a current device state. Therefore, when the beam characteristic is estimated by using the function generated based on the old data sets, the error between the beam characteristic estimated by using the function and one c in the current device state increases. Accordingly, it is possible that the accuracy in estimating the beam characteristic may be lowered.

The function generation unit 68 may adopt a plurality of classifications for the plurality of data sets, which classifications are different from each other depending on a type of the beam characteristics to be estimated. A first function $f_1$ for estimating a first beam characteristic $q_1$ (for example, the beam current) from a first specific parameter $p_1$ (for example, the operation parameter of the ion source 10) is generated for each of the clusters classified based on the operation parameter different from the first specific parameter $p_1$. In addition, a second function $f_2$ for estimating a second beam characteristic $q_2$ (for example, the center of the beam angle in the x-direction) from a second specific parameter $p_2$ (for example, the operation parameter of the bending electromagnet 30) is generated for each of the clusters classified based on the operation parameter different from the second specific parameter $p_2$. As a result, the classification of the plurality of clusters corresponding to each of the plurality of first functions $f_1$ may be different from the classification of the plurality of clusters corresponding to each of the plurality of second functions $f_2$. When the plurality of clusters are classified based on the operation parameter different from both the first specific parameter $p_1$ and the second specific parameter $p_2$, the classification of the plurality of clusters corresponding to each of the plurality of first functions $f_1$ may be common to the classification of the plurality of clusters corresponding to each of the plurality of second functions $f_2$.

The estimation unit 64 estimates the beam characteristic by using the function generated by the function generation unit 68. When the plurality of functions corresponding to the plurality of clusters are generated by the function generation unit 68, the estimation unit 64 selects an optimum one of the plurality of functions, and estimates the beam characteristic by using the selected function. The estimation unit 64 specifies one of the plurality of clusters to which the current device state belongs, and estimates the beam characteristic by using the function corresponding to the specified cluster. Specifically, the estimation unit 64 specifies one of the plurality of clusters to which the data set indicating the current device state belongs, and estimates the beam characteristic by using the function corresponding to the specified cluster. The data set used for specifying the cluster may be a complete data set having all the beam characteristics similar to the data set stored in the storage device 56, or may be an incomplete data set lacking the measurement values of some beam characteristics. For example, the incomplete data set is generated during the adjustment process in FIG. 3.

Figure 8:
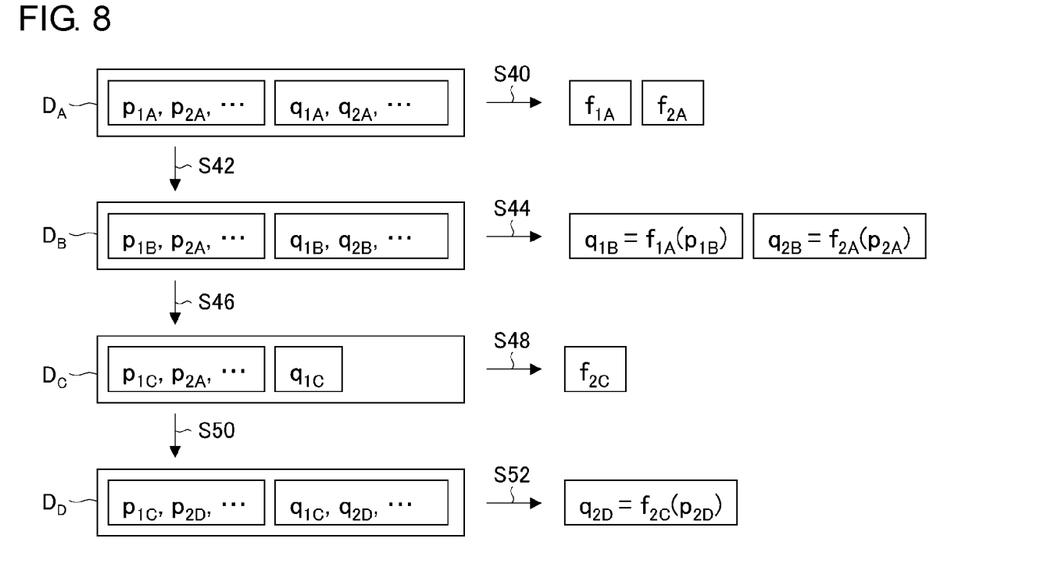
FIG. 8 is a view schematically illustrating an example of an estimation method for a beam characteristic.

FIG. 8 is a view schematically illustrating an example of an estimation method for the beam characteristic. FIG. 8 illustrates a flow of specifying the function corresponding to the current device state, estimating the beam characteristic by using the specified function, and changing the operation parameter, based on the estimated value of the beam characteristic. A first data set $D_A$ indicates the device state before the operation parameter is changed in the adjustment process. The first data set $D_A$ includes a set value $p_{1A}$ of the first specific parameter, a set value $p_{2A}$ of the second specific parameter, a measurement value $q_{1A}$ of the first beam characteristic, and a measurement value $q_{2A}$ of the second beam characteristic. An example of the first data set $D_A$ is the initial parameters set in S10 in FIG. 3. For example, the first data set $D_A$ is operation parameters having an actual result of the operation in the latest ion implantation process.

The estimation unit 64 specifies the cluster to which the first data set $D_A$ belongs, and specifies the first function $f_{1A}$ and the second function $f_{2A}$ which correspond to the specified cluster (S40). The first function $f_{1A}$ is the function for estimating the first beam characteristic $q_1$ from the first specific parameter $p_1$. The second function $f_{2A}$ is the function for estimating the second beam characteristic $q_2$ from the second specific parameter $p_2$. The first function $f_{1A}$ and the second function $f_{2A}$ which are specified based on the first data set $D_A$ are the functions that can highly accurately estimate the beam characteristics in the device state immediately before the adjustment process starts. It is considered that the device state immediately before the adjustment process starts is the same as or sufficiently similar to the device state during the adjustment process. Therefore, the first function $f_{1A}$ and the second function $f_{2A}$ which are specified based on the first data set $D_A$ can be used as the functions for highly accurately estimating the beam characteristics during the adjustment process.

In order to adjust the first beam characteristic $q_1$, the automatic adjusting unit 60 determines a set value $p_{1B}$ after changing the first specific parameter (S42). The estimation unit 64 inputs the changed set value $p_{1B}$ of the first specific parameter to the first function $f_{1A}$ specified in S40. In this manner, the estimation unit 64 calculates an estimated value $q_{1B}=f_{1A}(p_{1B})$ of the first beam characteristic (S44) after changing the first specific parameter. The estimation unit 64 may input the set value $p_{2A}$ of the second specific parameter to the second function $f_{2A}$ specified in S40. In this manner, the estimation unit 64 may calculate an estimated value $q_{2B}=f_{2A}(p_{2A})$ of the second beam characteristic (S44). A second data set $D_B$ indicating the device state during the adjustment of the first beam characteristic $q_1$ includes the set value $p_{1B}$ of the changed first specific parameter and the estimated value $q_{1B}$ of the first beam characteristic after changing the first specific parameter. The estimated value $q_{1B}$ of the first beam characteristic is calculated in S44. Accordingly, the automatic adjusting unit 60 can skip the measurement of the first beam characteristic, and can adjust the operation parameter based on the estimated value $q_{1B}$. When the estimated value $q_{1B}$ of the first beam characteristic calculated in S44 satisfies a desired condition, adjusting the first beam characteristic $q_1$ can be completed, and the process can proceed to the adjustment of another beam characteristic.

In the example in FIG. 8, in order to adjust the first beam characteristic $q_1$, the set value of the first specific parameter is changed from $p_{1B}$ to $p_{1C}$, and a measurement value $q_{1C}$ is acquired by measuring the first beam characteristic $q_1$ (S46). A third data set $D_C$ includes the changed set value $p_{1C}$ of the first specific parameter and the measurement value $q_{1C}$ of the first beam characteristic. The third data set $D_C$ indicates the device state when adjusting the first beam characteristic $q_1$ is completed during the adjustment process. The estimation unit 64 specifies the cluster to which the third data set $D_C$ belongs, and specifies a second function $f_{2C}$ corresponding to the specified cluster (S48). The second function $f_{2C}$ specified based on the third data set $D_C$ is the function that can highly accurately estimate the second beam characteristic $q_2$ in the device state during the adjustment process. The second function $f_{2C}$ specified in S48 may be the same as the second function $f_{2A}$ specified in S40. However, in some cases, the second function $f_{2C}$ may be different from the second function $f_{2A}$ depending on an adjustment conditions of the operation parameters.

In order to adjust the second beam characteristic $q_2$, the automatic adjusting unit 60 determines a changed set value $p_{2D}$ of the second specific parameter (S50). The estimation unit 64 inputs the changed set value $p_{2D}$ of the second specific parameter to the second function $f_{2C}$ specified in S48. In this manner, the estimation unit 64 calculates an estimated value $q_{2D}=f_{2C}(p_{2D})$ of the second beam characteristic after changing the second specific parameter (S52). The estimated value $q_{2D}$ of the second beam characteristic is calculated in S52. Accordingly, the automatic adjusting unit 60 can skip the measurement of the second beam characteristic, and can adjust the operation parameter based on the estimated value $q_{2D}$. In addition, when the estimated value $q_{2D}$ of the third beam characteristic calculated in S52 satisfies a desired condition, adjusting the second beam characteristic $q_2$ can be completed, and the process can proceed to the adjustment of another beam characteristic.

The first function $f_{1A}$ specified in S40 in FIG. 8 corresponds to the cluster to which the first data set $D_A$ belongs. The first data set $D_A$ is the data set before the adjustment process is performed, and includes the set values before the change in the plurality of operation parameters and the measurement values of the beam characteristics of the ion beam generated by the beam generation device 90 in which the set values before the change are set. Therefore, the first function $f_{1A}$ is the function corresponding to the cluster having the data set including the set values before the change in the plurality of operation parameters and the measurement values of the beam characteristics of the ion beam generated by the beam generation device 90 in which the set values before the change are set. In S44, the changed set value $p_{1B}$ of the first specific parameter is input to the first function $f_{1A}$, thereby calculating the estimated value $q_{1B}$ of the first beam characteristic. In this manner, in an early stage of the adjustment process, the first beam characteristic can be estimated without the measurement.

In addition, the first data set $D_A$ includes the measurement value $q_{2A}$ of the second beam characteristic of the ion beam generated by the beam generation device 90 in which the set values before the change are set. Therefore, the first function $f_{1A}$ is the function corresponding to the cluster having the data set including the set values before the change in the plurality of operation parameters and the measurement value $q_{2A}$ of the second beam characteristic different from the first beam characteristic of the ion beam generated by the beam generation device 90 in which the set values before the change are set. In S44, the changed set value $p_{1B}$ of the first specific parameter is input to the first function $f_{1A}$, thereby calculating the estimated value $q_{1B}$ of the first beam characteristic different from the second beam characteristic.

The second function $f_{2C}$ specified in S48 in FIG. 8 corresponds to the cluster to which the third data set $D_C$ belongs. The third data set $D_C$ is the data set used during the adjustment process, and includes the changed set values of the plurality of operation parameters and the measurement value $q_{1C}$ of the first beam characteristic different from the second beam characteristic of the ion beam generated by the beam generation device 90 in which the changed set values are set. Therefore, the second function $f_{2C}$ is the function corresponding to the cluster having the data set including the changed set values of the plurality of operation parameters and the measurement value $q_{1C}$ of the first beam characteristic different from the second beam characteristic of the ion beam generated by the beam generation device 90 in which the changed set values are set. In S52, the changed set value $p_{2D}$ of the second specific parameter is input to the second function $f_{2C}$, thereby calculating the estimated value $q_{2D}$ of the second beam characteristic different from the first beam characteristic. In this manner, the second beam characteristic different from the first beam characteristic can be estimated without the measurement by using the second function $f_{2C}$ that reflects the device state during the adjustment process.

An example of the first beam characteristic measured during the adjustment process is the beam current. For example, the beam current can be measured by the beam monitor 41 on the most downstream side of the beamline, and thus, a time required for the measurement is short.

Therefore, the beam current may be adjusted, based on an actual measurement value, instead of skipping the measurement and estimating the beam current. An example of the second beam characteristic estimated during the adjustment process is the beam angle, the beam parallelism or the beam current density distribution. For example, the beam angle, the beam parallelism, and the beam current density distribution need to be measured while the beam profiler 42 is moved in the x-direction, and thus, a time required for the measurement is relatively long. Therefore, when the measurement is repeated to perform the adjustment, a time required until the adjustment is completed is significantly lengthened. Therefore, with regard to the beam angle, the beam parallelism, or the beam current density distribution, there is a great advantage when the measurement is skipped by estimating the beam characteristic instead of the actual measurement.

According to the present embodiment, the beam characteristic is estimated, and the measurement of the beam characteristic is omitted when the operation parameter is adjusted. Accordingly, a time required for measuring the beam characteristics can be shortened, and the operation parameter can more quickly adjusted. In addition, according to the present embodiment, the correlation between the beam characteristic to be adjusted and the specific parameter is specified by the function. Accordingly, the changed set value of the specific parameter for obtaining the desired beam characteristic is derived by using the function. Therefore, the operation parameter can more quickly adjusted, compared to a case where the operation parameter is adjusted by repeating the measurement and the adjustment through trial and error. In addition, the beam characteristic may be measured after the adjustment based on the estimated value is completed. Accordingly, while the beam characteristic of the ion beam used for the ion implantation process can finally be confirmed, a time required for the adjustment can be shortened by reducing the number of times for measuring the beam characteristic in the whole adjustment process. In this manner, productivity of the ion implanter can be improved while the beam characteristic can highly accurately be adjusted.

Hitherto, the present invention has been described with reference to the above-described respective embodiments. However, the present invention is not limited to the above-described respective embodiments. Those in which configurations of the respective embodiments are appropriately combined or replaced with each other are also included in the present invention. Based on the knowledge of those skilled in the art, the respective embodiments can be combined with each other, the processing sequences can be appropriately rearranged, or various modifications such as design changes can be added to the embodiment. The embodiment having the added modifications can also be included in the scope of the present invention. In addition, the semiconductor wafer has been described as an example in the respective embodiments. However, without being limited to the semiconductor wafer, the present invention is applicable to any desired workpiece (for example, a wafer or a substrate). Another specific example of the workpiece includes a flat panel display substrate (for example, a glass substrate).

It should be understood that the invention is not limited to the above-described embodiment, but may be modified into various forms on the basis of the spirit of the invention. Additionally, the modifications are included in the scope of the invention.

What is claimed is:

1. An ion implanter comprising:
a beam generation device that generates an ion beam with which a workpiece is irradiated;
a control device that sets a plurality of operation parameters for controlling an operation of the beam generation device;
a measurement device that measures at least one of beam characteristics of the ion beam;
a storage device that accumulates data sets in each of which a set of set values of the plurality of operation parameters and a measurement value of the at least one of the beam characteristics of the ion beam are associated with each other; and
an analysis device that generates a function for estimating the at least one of the beam characteristics from a set value of at least one of specific parameters included in the plurality of operation parameters, based on a plurality of the data sets accumulated in the storage device,
wherein when the set value of the at least one of the specific parameters included in the plurality of operation parameters is changed, the control device inputs the changed set value of the at least one of the specific parameters into the function, and calculates an estimated value of the at least one of the beam characteristics.

2. The ion implanter according to claim 1,
wherein the control device adjusts the at least one of the specific parameters included in the plurality of operation parameters, based on the estimated value.

3. The ion implanter according to claim 1,
wherein the control device causes the measurement device to skip measurement of the at least one of the beam characteristics, when the estimated value satisfies a predetermined condition.

4. The ion implanter according to claim 1,
wherein the control device causes the measurement device to measure the at least one of the beam characteristics, when the estimated value does not satisfy a predetermined condition.

5. The ion implanter according to claim 4,
wherein the control device adjusts the at least one of the specific parameters included in the plurality of operation parameters, based on the measurement value of the at least one of the beam characteristics and the function.

6. The ion implanter according to claim 1,
wherein when a new data set is accumulated in the storage device, the analysis device updates the function by using the new data set.

7. The ion implanter according to claim 1,
wherein the analysis device classifies a plurality of the data sets accumulated in the storage device into a plurality of clusters, and generates a plurality of the functions respectively corresponding to the plurality of clusters, and
the control device calculates the estimated value by using any one of the plurality of functions.

8. The ion implanter according to claim 7,
wherein the control device specifies one of the plurality of clusters into which the plurality of operation parameters including the changed set value of the at least one of the specific parameters is classified and calculates the estimated value by using the function corresponding to the specified cluster.

9. The ion implanter according to claim 7,
wherein the measurement device measures a first beam characteristic of the ion beam generated by the beam generation device for which the plurality of operation parameters including the changed set value of the at least one of the specific parameters are set, and the control device specifies one of the plurality of clusters into which the data set including the plurality of operation parameters including the changed set value of the at least one of the specific parameters and a measurement value of the first beam characteristic is classified, and calculates an estimated value of a second beam characteristic different from the first beam characteristic by using the function corresponding to the specified cluster.

10. The ion implanter according to claim 7, the control device specifies one of the plurality of clusters into which the plurality of operation parameters including the set value of the at least one of the specific parameters before changing is classified, and calculates the estimated value by using the function corresponding to the specified cluster.

11. The ion implanter according to claim 7, wherein the measurement device measures a first beam characteristic of the ion beam generated by the beam generation device for which the plurality of operation parameters including the set value of the at least one of the specific parameters before changing are set, and the control device specifies one of the plurality of clusters into which the data set including the plurality of operation parameters including the set value of the at least one of the specific parameters before the changing and a measurement value of the first beam characteristic is classified, and calculates an estimated value of a second beam characteristic different from the first beam characteristic by using the function corresponding to the specified cluster.

12. The ion implanter according to claim 8, wherein the analysis device classifies the plurality of data sets into the plurality of clusters, based on a correlation between set values of two or more of the plurality of operation parameters different from the at least one of the specific parameters.

13. The ion implanter according to claim 8, wherein the control device causes the measurement device to skip measurement of the at least one of the beam characteristics, when at least any of the number and accumulation timings of the data sets included in the specified cluster satisfies a predetermined condition.

14. The ion implanter according to claim 7, wherein when a new data set is accumulated in the storage device, the analysis device updates the classification of the data sets into a plurality of clusters by using the new data set, and generates a plurality of functions respectively corresponding to the plurality of clusters formed by the updated classification.

15. The ion implanter according to claim 1, wherein the beam generation device includes an ion generation device and a beamline device that transports the ion beam extracted from the ion generation device, the at least one of the beam characteristics is a beam current of the ion beam transported by the beamline device, and the at least one of the specific parameters is an operation parameter for controlling an operation of the ion generation device.

16. The ion implanter according to claim 1, wherein the beam generation device includes a deflection device that deflects the ion beam by applying at least one of an electric field and a magnetic field to the ion beam, the at least one of the beam characteristics is an angle of the ion beam with respect to a deflection direction in which the ion beam is deflected by the deflection device, and the at least one of the specific parameters is an operation parameter for controlling an operation of the deflection device.

17. The ion implanter according to claim 1, wherein the beam generation device includes a lens device that causes the ion beam to converge or diverge by applying at least one of an electric field and a magnetic field to the ion beam, the at least one of the beam characteristics is a beam size or a focusing/defocusing angle of the ion beam, and the at least one of the specific parameters is an operation parameter for controlling an operation of the lens device.

18. The ion implanter according to claim 1, wherein the beam generation device includes a scanner that causes the ion beam to reciprocate for scanning by applying at least one of an electric field and a magnetic field to the ion beam, and a lens device that parallelizes the ion beam caused to reciprocate for the scanning by the scanner by applying at least one of an electric field and a magnetic field, the at least one of the beam characteristics is parallelism of the ion beam, and the at least one of the specific parameters is an operation parameter for controlling an operation of the lens device.

19. An ion implantation method comprising:

accumulating data sets in each of which a set of set values of a plurality of operation parameters for controlling an operation of a beam generation device generating an ion beam and a measurement value of at least one of beam characteristics of the ion beam are associated with each other;

classifying a plurality of the accumulated data sets into a plurality of clusters;

generating a plurality of functions for estimating the at least one of the beam characteristics from a set value of at least one of specific parameters included in the plurality of operation parameters, the plurality of functions respectively corresponding to the plurality of clusters;

specifying one of the plurality of clusters into which the plurality of operation parameters including the set value of the at least one of the specific parameters before or after changing is classified, when the set value of the at least one of the specific parameters included in the plurality of operation parameters set for the beam generation device is changed; and inputting the changed set value of the at least one of the specific parameters into the function corresponding to the specified cluster, and calculating an estimated value of the at least one of the beam characteristics.

* * * * *